United States Patent
Mori et al.

(10) Patent No.: US 8,148,774 B2
(45) Date of Patent: Apr. 3, 2012

(54) METHOD OF FABRICATING SEMICONDUCTOR DEVICE WITH A HIGH BREAKDOWN VOLTAGE BETWEEN NEIGHBORING WELLS

(75) Inventors: Hidemitsu Mori, Kawasaki (JP); Kazuhiro Takimoto, Kawasaki (JP); Toshiyuki Shou, Kawasaki (JP); Kenji Sasaki, Kawasaki (JP); Yutaka Akiyama, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 352 days.

(21) Appl. No.: 12/606,634

(22) Filed: Oct. 27, 2009

(65) Prior Publication Data

US 2010/0102420 A1      Apr. 29, 2010

(30) Foreign Application Priority Data

Oct. 28, 2008  (JP) ................................ 2008-276394

(51) Int. Cl.
  *H01L 29/66*    (2006.01)
  *H01L 21/8238*  (2006.01)
(52) U.S. Cl. . 257/328; 257/511; 257/544; 257/E29.005; 257/E29.174; 257/E21.334; 438/212; 438/356; 438/419
(58) Field of Classification Search ........................ None
See application file for complete search history.

(56) References Cited

U.S. PATENT DOCUMENTS

| | | | | |
|---|---|---|---|---|
| 5,034,337 | A * | 7/1991 | Mosher et al. | 438/220 |
| 5,536,665 | A * | 7/1996 | Komori et al. | 438/420 |
| 6,225,674 | B1 * | 5/2001 | Lim et al. | 257/506 |
| 6,979,845 | B2 | 12/2005 | Kawaguchi et al. | |
| 7,868,414 | B2 * | 1/2011 | Williams et al. | 257/513 |
| 2008/0197408 | A1 * | 8/2008 | Disney et al. | 257/335 |

FOREIGN PATENT DOCUMENTS

JP     2002-289704 A    10/2002
JP     2004-235475 A    8/2004

* cited by examiner

*Primary Examiner* — Alonzo Chambliss
(74) *Attorney, Agent, or Firm* — Sughrue Mion, PLLC

(57) ABSTRACT

To provide a semiconductor device in which an interval between first wells can be shortened by improving a separation breakdown voltage between the first wells and a method for manufacturing the same. A semiconductor device includes a first conductivity type semiconductor substrate 1, second conductivity type first wells 2 and 3 disposed on a surface layer of the semiconductor substrate 1 with a predetermined interval between them, a first conductivity type second well 4 disposed between the first wells 2 and 3 on the surface layer of the semiconductor substrate 1 and having an impurity concentration higher than that of the semiconductor substrate, a first conductivity type third well 5 at least disposed below the second well 4 in the semiconductor substrate 1 and having an impurity concentration higher than that of the semiconductor substrate 1 and lower than that of the second well 4, and a first conductivity type fourth well 11 at least disposed below the third well 5 in the semiconductor substrate 1 and having an impurity concentration higher than that of the semiconductor substrate 1 and lower than that of the second well 4.

11 Claims, 8 Drawing Sheets

(EXAMPLE 1)

(EXAMPLE 1)

FIG. 5 RELATED ART (COMPARATIVE EXAMPLE)

(EXAMPLE 2)

(CONVENTIONAL EXAMPLE 2)

(CONVENTIONAL EXAMPLE 3)

METHOD OF FABRICATING SEMICONDUCTOR DEVICE WITH A HIGH BREAKDOWN VOLTAGE BETWEEN NEIGHBORING WELLS

TECHNICAL FIELD

Reference to Related Application

This application is based upon and claims the benefit of the priority of Japanese patent application No. 2008-276394, filed on Oct. 28, 2008, the disclosure of which is incorporated herein in its entirety by reference thereto.

The present invention relates to a semiconductor device and a method for manufacturing the same, and in particular, it relates to a semiconductor device requiring a high breakdown voltage between neighboring wells thereof and a method for manufacturing the same.

BACKGROUND

Recently, operating frequencies of semiconductor devices are being greatly increased, and as a result, wiring areas assigned to power supply wirings and ground wirings tend to be increased. Thus, when a semiconductor device is actually used, an instantaneous surge voltage is easily caused, damaging inner circuits therein. Further, when a high voltage is constantly applied to a semiconductor device, inner circuits therein are also damaged easily. Thus, in order to prevent damage to the inner circuits from such surge voltage or high voltage, Patent Document 1 discloses a semiconductor device having two or more adjacent N-wells sandwiching a region of a predetermined width on a P-type silicon substrate. The substrate includes a P-well region between the adjacent N-wells via offset regions (see Patent Document 1; conventional example 1).

Also, in recent years, with the miniaturization of semiconductor devices, there is a demand for a decrease of an interval between N-wells. Further, in the case of an embedded flash process or the like, when data is written in or erased from a flash memory, application of a voltage higher than that of a basic process is often required. Thus, it is becoming more difficult to maintain punch through between N-wells at a basic-process level. Since an offset region is formed between an N-well and a P-well in the semiconductor device disclosed in Patent Document 1, it is difficult to shorten the interval between the N-wells, and therefore, there is a limit to suppression of such punch through between the N-wells. Thus, in order to achieve a decrease of the interval between the N-wells and a suppression of the punch through between the N-wells, Patent Document 2 discloses a semiconductor device in which N-wells 102 and 103 are formed on a P-type semiconductor substrate 101 and a P-well 104 is formed between the N-wells 102 and 103. The substrate 101 includes a P-well 105 or a P-type epitaxial layer formed below the two N-wells 102 and 103 and the P-well 104 (see FIG. 7; conventional example 2).

Patent Document 1:
Japanese Patent Kokai Publication No. JP-P2002-289704A Patent Document 2:
Japanese Patent Kokai Publication No. JP-P2004-235475A

SUMMARY

The entire disclosures of Patent Documents 1 and 2 are incorporated herein by reference thereto.

However, the present inventors have found that the following new problems make it difficult to effectively reduce an interval between N-wells in a miniaturized semiconductor device supplied with a high voltage.

Referring to FIG. 8, originally, the N-wells 102 and 103 and P-well 104 are formed to a depth D1. However, while N+ diffusion layers 107 and 108 are normally formed on the N-wells 102 and 103 for connection to a contact plug, since trench isolation insulating films 106 are composed of amorphous silicon dioxide and the N+ diffusion layers 107 and 108 are composed of crystalline silicon, channeling (transmission of impurities) occurs below the N+ diffusion layers 107 and 108. Thus, the N-wells 102 and 103 are deeply-implanted into the substrate through a P-well 105, forming deeply-implanted N-wells 109 and 110 (conventional example 3). Therefore, in the case of a further miniaturized semiconductor device, in addition to punch through between the N-wells 102 and 103 immediately below the P-well 104, punch through may also be caused between the deeply-implanted N-wells 109 and 110, resulting in deficiency in breakdown voltage between the N-wells 102 and 103. This phenomenon may be more significant when a higher voltage is applied.

It is a primary object of the present invention to provide a semiconductor device in which an interval between N-wells can be shortened by improving a separation breakdown voltage between the N-wells and a method for manufacturing the same.

In a first aspect of the present invention, there is provided a semiconductor device comprising: a first conductivity type semiconductor substrate; two first wells of a second conductivity type, which is opposite to the first conductivity type, arranged on a surface layer of the semiconductor substrate with a predetermined interval therebetween; and a first conductivity type second well arranged between the two first wells on the surface layer of the semiconductor substrate and having an impurity concentration higher than that of the semiconductor substrate. The semiconductor device further comprises a first conductivity type third well arranged in the semiconductor substrate, at least having an impurity concentration peak position below that of the second well and having an impurity concentration higher than that of the semiconductor substrate and lower than that of the second well; and a first conductivity type fourth well arranged in the semiconductor substrate, at least having an impurity concentration peak position below that of the third well and having an impurity concentration higher than that of the semiconductor substrate and lower than that of the second well.

In a second aspect of the present invention, there is provided a semiconductor device manufacturing method comprising: implanting ions into the entire surface of a first conductivity type semiconductor substrate to form a first conductivity type fourth well; and implanting ions into the entire surface of the semiconductor substrate to form a first conductivity type third well having an impurity concentration peak position higher than that of the fourth well. The method further comprises: forming a first conductivity type second well having an impurity concentration peak position higher than that of the third well at a predetermined area on a surface layer of the semiconductor substrate; and forming first wells of a second conductivity type, which is opposite to the first conductivity type, having an impurity concentration peak position higher than that of the third well at areas on both sides of the second well on the surface layer of the semiconductor substrate, respectively.

In a third aspect of the present invention, there is provided a semiconductor device manufacturing method comprising: forming a mask material having an opening in a predetermined area on a surface of a first conductivity type semiconductor substrate; implanting ions into the semiconductor substrate by using the mask material as a mask to form a first conductivity type fourth well; and implanting ions into the semiconductor substrate by using the mask material as a mask to form a first conductivity type third well having an impurity concentration peak position higher than that of the fourth well. The method further comprises: forming a first conductivity type second well having an impurity concentration peak position higher than that of the third well on a surface layer of the semiconductor substrate by using the mask material as a mask; and removing the mask material and forming first wells of a second conductivity type, which is opposite to the first conductivity type, having an impurity concentration peak position higher than that of the third well on both sides of the second well, respectively.

The meritorious effects of the present invention are summarized as follows.

According to the present invention, even in the case of a miniaturized semiconductor device, a separation breakdown voltage between the first wells is improved. Thus, an interval between the first wells can be shortened efficiently. In addition, even in a circuit supplied with a higher voltage, a separation breakdown voltage and an interval between the first wells can be maintained. Further, since it is only necessary to implant additional ions to a deep area in a substrate, adverse effects (change in well resistance, junction capacitance, or the like) which may be caused before or after the additional ion implantation can be minimized.

PREFERRED MODES

Preferred modes are forth below.
Mode 1.
   set forth as the first aspect.
Mode 2.
   The semiconductor device according to mode 1, further comprising a first conductivity type diffusion layer arranged on the first wells, respectively, and having an impurity concentration higher than that of the first wells.
Mode 3.
   The semiconductor device according to mode 1 or 2, wherein the third well has an impurity concentration peak position disposed at least below that of the second well and the first wells in the semiconductor substrate.
Mode 4.
   The semiconductor device according to any one of modes 1 to 3, wherein the impurity concentration peak position of the third well is deeper than that of the second well by 0.3 µm or more but not more than 0.8 µm, and the impurity concentration peak position of the fourth well is deeper than that of the third well by 0.3 µm or more but not more than 0.9 µm.
Mode 5.
   The semiconductor device according to any one of modes 1 to 4, wherein the impurity concentration of the third well and that of the fourth well are set to be increased as the interval between the two first wells decreases.
Mode 6.
   The semiconductor device according to any one of modes 1 to 5, wherein each of the third and fourth wells is an area formed by ion implantation.
Mode 7.
   The semiconductor device according to any one of modes 1 to 6, wherein the third well and the fourth well extend throughout the entire area of the substrate.
Mode 8.
   The semiconductor device according to any one of modes 1 to 6, wherein the third well and the fourth well are disposed in an area lying below the second well.
Mode 9.
   set forth as the second aspect.
Mode 10.
   set forth as the third aspect.

Figure 1:
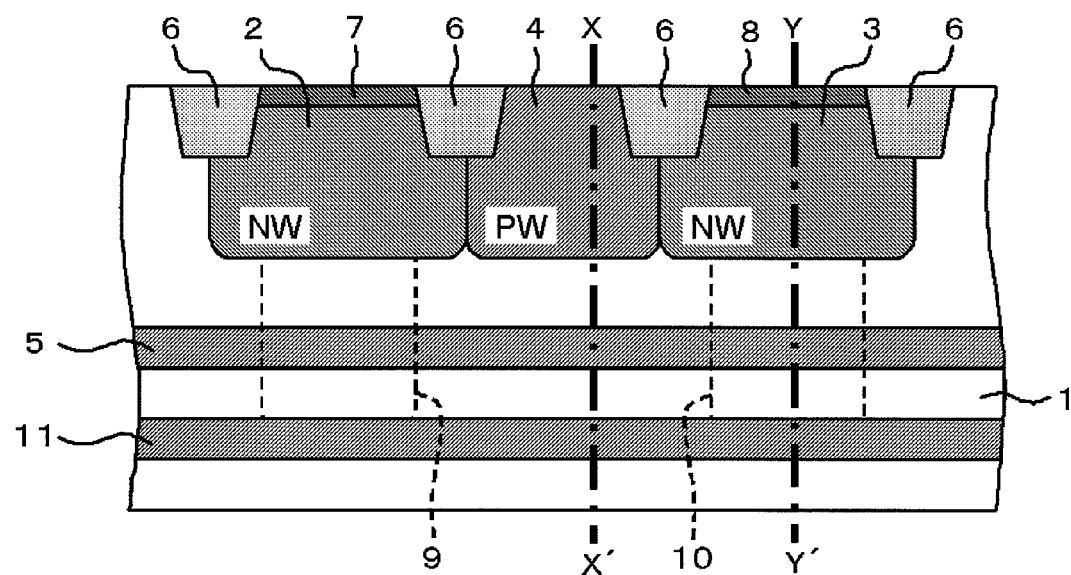
FIG. 1 schematically shows a partial cross section of a structure of a semiconductor device according to example 1 of the present invention.

A semiconductor device according to an exemplary embodiment of the present invention comprises: a first conductivity type semiconductor substrate (1 in FIG. 1); two first wells (2 and 3 in FIG. 1) of a second conductivity type, which is opposite to the first conductivity type, arranged on a surface layer of the semiconductor substrate (1 in FIG. 1) with a predetermined interval therebetween; a first conductivity type second well (4 in FIG. 1) arranged between the two first wells (2 and 3 in FIG. 1) on the surface layer of the semiconductor substrate (1 in FIG. 1) and having an impurity concentration higher than that of the semiconductor substrate (1 in FIG. 1); a first conductivity type third well (5 in FIG. 1) arranged in the semiconductor substrate (1 in FIG. 1), at least having an impurity concentration peak position below that of the second well (4 in FIG. 1) and having an impurity concentration higher than that of the semiconductor substrate (1 in FIG. 1) and lower than that of the second well (4 in FIG. 1); and a first conductivity type fourth well (11 in FIG. 1) arranged in the semiconductor substrate (1 in FIG. 1), at least having an impurity concentration peak position below that of the third well (5 in FIG. 1) and having an impurity concentration higher than that of the semiconductor substrate (1 in FIG. 1) and lower than that of the second well (4 in FIG. 1). Note, the reference symbols shown above within parentheses doubt an-example solely for illustrative purpose and should not be regarded as limitative.

Examples are further illustrated in more detail.

Example 1

Figure 2:
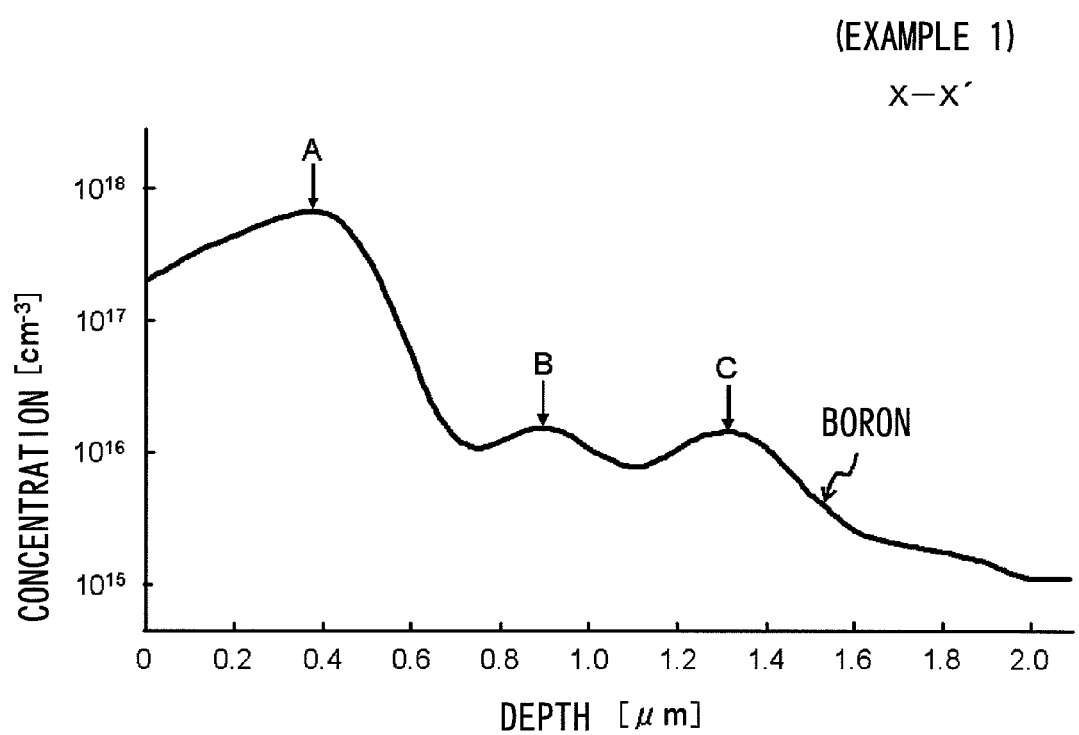
FIG. 2 is a graph illustrating a distribution of boron concentration with respect to the depth of a cross section taken along line X-X' shown in FIG. 1 based on the semiconductor device according to example 1 of the present invention.
Figure 3:
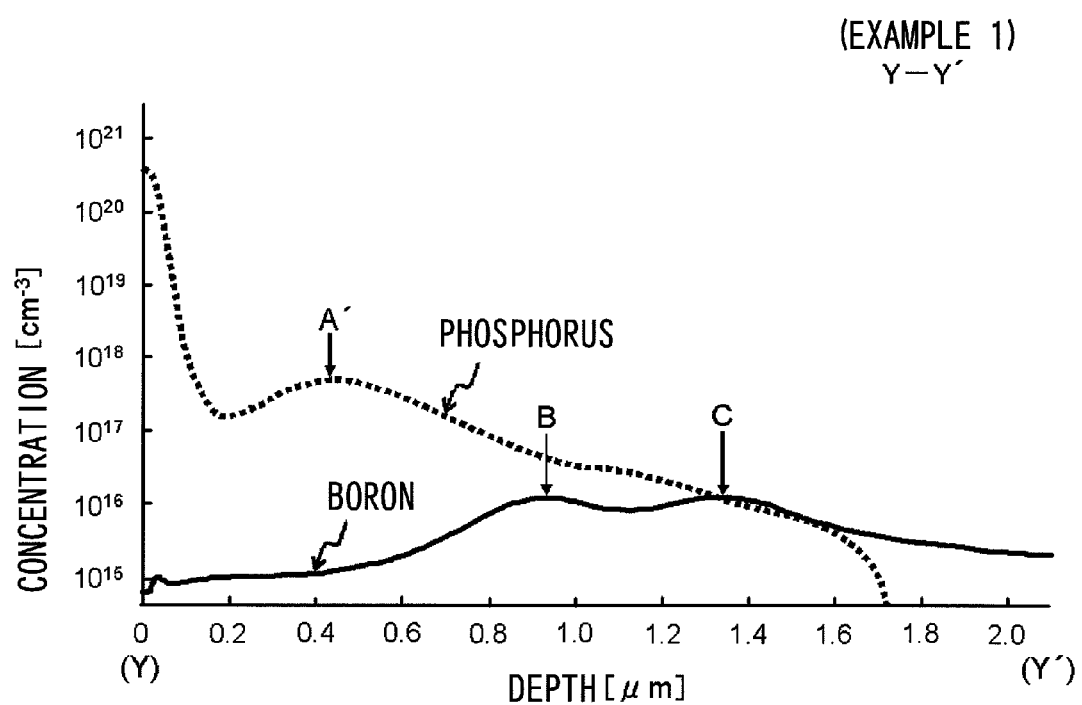
FIG. 3 is a graph illustrating a distribution of phosphorus concentration and boron concentration with respect to the depth of a cross section taken along Y-Y' line shown in FIG. 1 based on the semiconductor device according to example 1 of the present invention.
Figure 4:
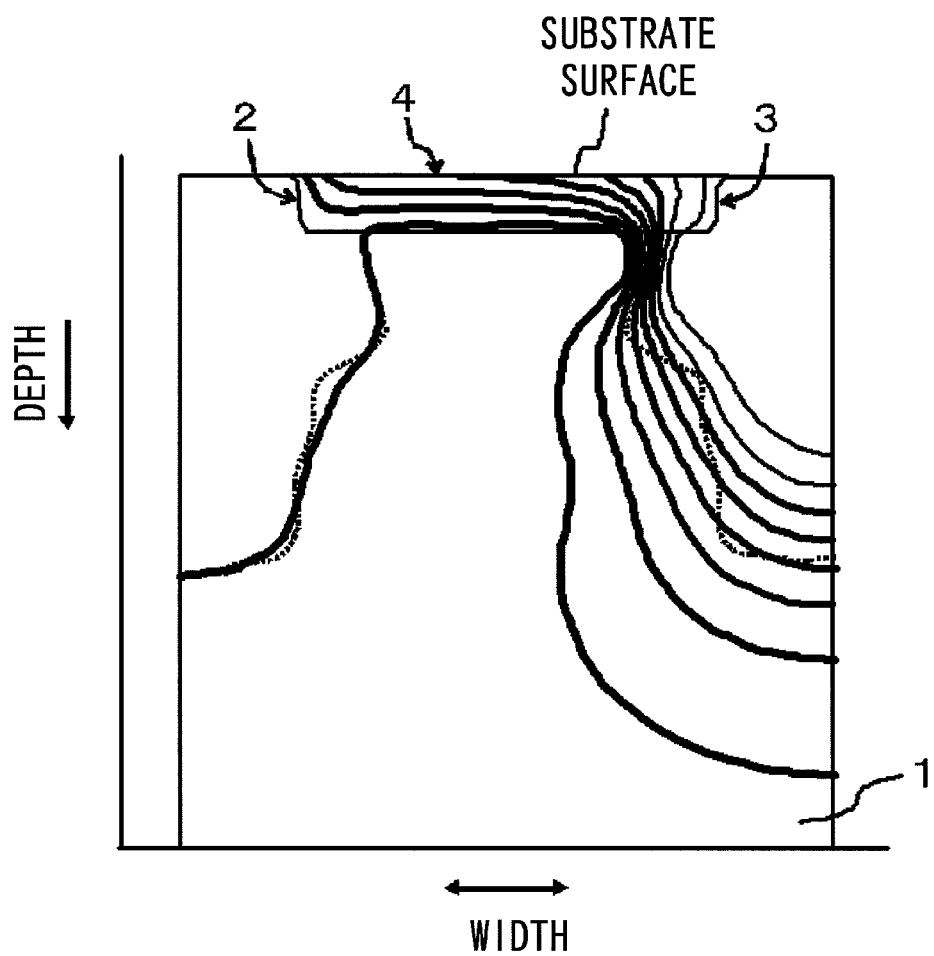
FIG. 4 schematically shows a potential distribution when a voltage is applied to one of the N-wells in the semiconductor device according to example 1 of the present invention.
Figure 5:
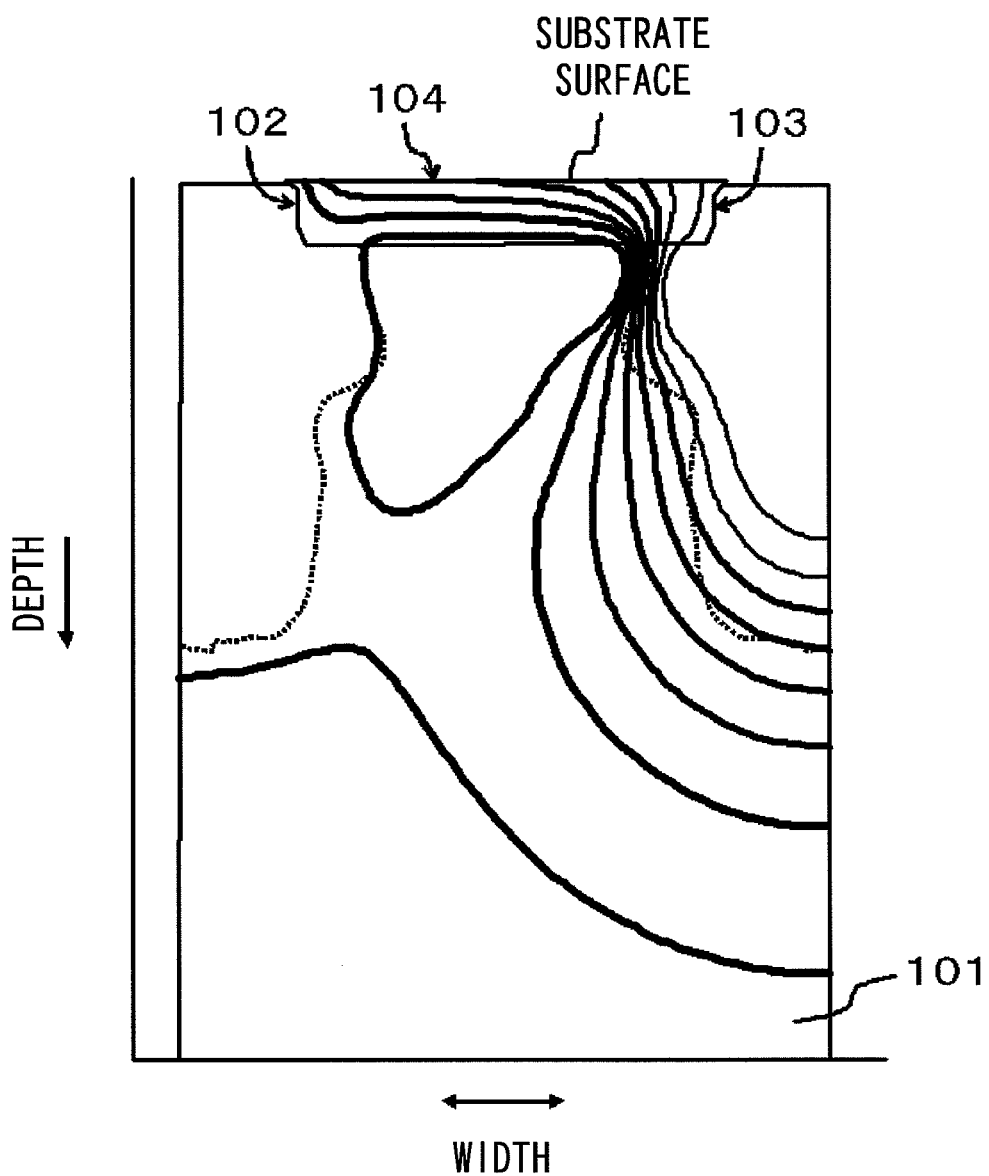
FIG. 5 schematically shows a potential distribution when a voltage is applied to one of the N-wells in the semiconductor device according to a comparative example (conventional example 3).
Figure 8:
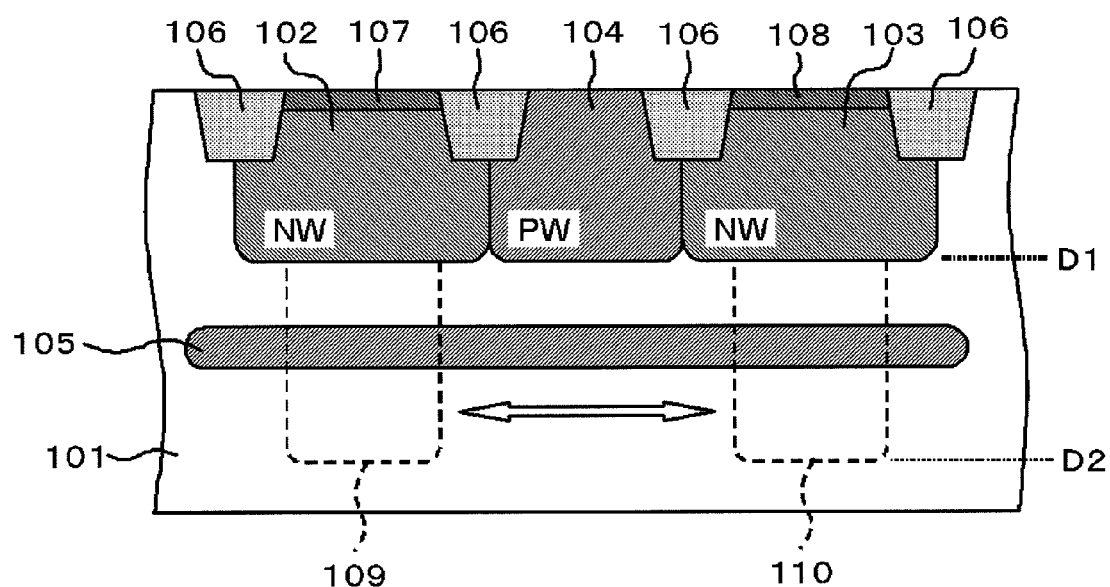
FIG. 8 schematically shows a partial cross section of a structure of a semiconductor device according to conventional example 3.

A semiconductor device according to example 1 of the present invention will be described with reference to drawings. FIG. 1 schematically shows a partial cross section of a structure of the semiconductor device according to example 1 of the present invention. FIG. 2 is a graph illustrating a distribution of boron concentration with respect to the depth of a cross section taken along line X-X' shown in FIG. 1 based on the semiconductor device according to example 1 of the present invention. FIG. 3 is a graph illustrating a distribution of phosphorus concentration and boron concentration with respect to the depth of a cross section taken along Y-Y' line shown in FIG. 1 based on the semiconductor device according to example 1 of the present invention. FIG. 4 schematically shows a potential distribution when a voltage is applied to one of the N-wells in the semiconductor device according to example 1 of the present invention. FIG. 5 schematically shows a potential distribution when a voltage is applied to one of the N-wells in the semiconductor device according to a comparative example (see conventional example 3 in FIG. 8). In example 1, a P-type semiconductor substrate 1 is used as a semiconductor substrate, two N-wells 2 and 3 are formed on the P-type semiconductor substrate 1, and a P-well 4 is formed between the two N-wells. Further, since the present description will be mainly made regarding a depletion layer extending from one of the N-wells 2 and 3 (N-well 3, for example) supplied with a high voltage inside the P-type semiconductor substrate 1, the structure near and above the surface of the P-type semiconductor substrate 1 is not shown.

Referring to FIG. 1, based on the semiconductor device according to example 1, the two N-wells 2 and 3 are formed on the P-type semiconductor substrate 1, where a high voltage needs to be applied such as for an input/output protection unit, a flash memory, and the peripheral circuits thereof, and the P-well 4 is formed between the N-wells 2 and 3. A P-well 5 is formed to extend throughout the entire area below the N-wells 2 and 3 and the P-well 4 (or to extend throughout the entire area of the substrate) with a peak position at a predetermined depth (distance) from the N-wells 2, 3 and P-well 4. Further, a P-well 11 is formed to extend throughout the entire area below the P-well 5 (or to extend throughout the entire area of the substrate) with a peak position at a given depth (distance) from the P-well 5. A trench isolation insulating film 6 is formed between the N-well 2 and the P-well 4, and another trench isolation insulating film 6 is formed between the N-well 3 and the P-well 4. In addition, the N-wells 2 and 3 are each provided with another trench isolation insulating film 6, on the opposite side of the P-well 4, between the respective N-well and a neighboring element (not shown). N+ diffusion layers 7 and 8 are formed on the N-wells 2 and 3, respectively, for connection to a contact plug (not shown). Below the N-wells 2 and 3, there are formed deeply-implanted N-wells 9 and 10, respectively, which are implanted deeply into the substrate through channeling that occurs when the N+ diffusion layers 7 and 8 are formed.

The P-type semiconductor substrate 1 is a semiconductor substrate formed by including a P-type impurity (boron, for example) in silicon.

Each of the N-wells 2 and 3 is an impurity region formed by implanting an N-type impurity (arsenic or phosphorus, for example) into the P-type semiconductor substrate 1.

The P-well 4 is an impurity region formed by implanting a P-type impurity (boron, for example) having an impurity concentration higher than that of the P-type semiconductor substrate 1 into the P-type semiconductor substrate 1. An impurity concentration peak position (arrow A in FIG. 2) of the P-well 4 is approximately equal to that (arrow A' in FIG. 3) of the N-wells 2 and 3.

The P-well 5 is an impurity region formed by implanting a P-type impurity (boron, for example) having an impurity concentration higher than that of the P-type semiconductor substrate 1 and lower than that of the P-well 4 into the P-type semiconductor substrate 1. An impurity concentration peak position (arrow B) of the P-well 5 is set, for example, approximately 0.3 to 0.8 μm deeper than the impurity concentration peak position (arrow A) of the P-well 4 (see FIG. 2). The P-well 5 can be formed, for example, by implanting boron into the P-type semiconductor substrate 1 in a dose amount of $1\times10^{11}$ to $5\times10^{12}$ cm$^{-2}$ with an ion implantation energy of 300 to 500 keV. The dose amount is set based on an interval between the N-wells 2 and 3. A larger dose amount is set as the interval between the N-wells 2 and 3 shortens.

The trench isolation insulating film 6 is an insulation film formed by filling a trench with amorphous silicon dioxide, for example.

Each of the N+ diffusion layers 7 and 8 is an impurity region implanted with an N-type impurity (phosphorus, for example) having an impurity concentration higher than that of the N-wells 2 and 3.

Each of the deeply-implanted N-wells 9 and 10 is an impurity region in which a P-type impurity (boron, for example) having an impurity concentration lower than that of the N-wells 2 and 3 is diffused.

The P-well 11 is an impurity region formed by implanting a P-type impurity (boron, for example) having an impurity concentration higher than that of the P-type semiconductor substrate 1 and approximately equal to or lower than that of the P-well 5 into the P-type semiconductor substrate 1. An impurity concentration peak position (arrow C) of the P-well 11 is set approximately 0.3 to 0.9 μm deeper than the impurity concentration peak position (arrow B) of the P-well 5 (see FIG. 2). The P-well 11 can be formed, for example, by implanting boron into the P-type semiconductor substrate 1 in a dose amount of $1\times10^{11}$ to $5\times10^{12}$ cm$^{-2}$ with an ion implantation energy of 600 to 900 keV. The ion implantation energy required for the P-well 11 is set higher than that required for the P-well 5. The dose amount is set based on an interval between the N-wells 2 and 3. A larger dose amount is set as the interval between the N-wells 2 and 3 shortens.

FIG. 4 shows a potential distribution obtained when the P-type semiconductor substrate 1, the N-well 2, and the P-well 4 are connected to ground and a voltage of 7 V is applied to the N-well 3 based on the above structure. The ion implantation energy and the dose amount for the P-well 11 are 700 keV and $5\times10^{11}$ cm$^{-2}$, respectively. The ion implantation energy and the dose amount for the P-well 5 are 400 keV and $5\times10^{11}$ cm$^{-2}$, respectively. FIG. 5 shows a potential distribution of a cross section of a structure of a semiconductor structure shown in FIG. 8 (conventional example 3). The ion implantation energy and the dose amount for a P-well 105 are 400 keV and $5\times10^{11}$ cm$^{-2}$, respectively. Comparison between FIGS. 4 and 5 shows that while the potential distribution of FIG. 4 (example 1) is seen within a certain depth, the potential distribution of FIG. 5 (comparative example) extends more downwards and sideways. Thus, it can be seen that, based on the structure of example 1 (FIG. 4), the depletion layer extending from the N-well 3 is set within a certain depth and the punch through is prevented.

Next, a method for manufacturing the semiconductor device according to example 1 of the present invention will be described. Note, focusing at the 8th line from the top, it extends at significantly elevated positions below the P-well 4 and laterally limited positions in FIG. 4 as compared with FIG. 5.

First, a silicon dioxide film is formed on the P-type semiconductor substrate 1, and a silicon nitride film is formed on the silicon dioxide film. Openings for the trench isolation insulating films 6 are formed in the silicon dioxide film and the silicon nitride film.

Next, by using the silicon dioxide film and the silicon nitride film having the openings as masks, portions of the P-type semiconductor substrate 1 exposed in the openings are removed by etching, so as to form trenches each having a predetermined depth.

Next, a silicon dioxide film (which will be used as the trench isolation insulating films 6) is deposited by chemical vapor deposition (CVD) on the entire surface of the substrate. Subsequently, by using the silicon nitride film as a stopper film, the silicon dioxide film formed by CVD is planarized by chemical mechanical polishing (CMP).

Next, the silicon dioxide film and the silicon nitride film used as masks are removed.

Next, the P-well 11 is formed by implanting ions into the entire surface of the substrate (wafer).

Next, the P-well 5 is formed by implanting ions into the entire surface of the substrate (wafer). The ion implantation energy for the formation of the P-well 5 is smaller than that for the formation of the P-well 11.

Next, a mask material such as a resist film is formed on the surface of the substrate, and ions are implanted into the substrate to form the P-well 4. Thereafter, the mask material is removed.

Next, a mask material such as a resist film is formed on the surface of the substrate, and ions are implanted into the substrate to form the N-wells 2 and 3. Thereafter, the mask material is removed.

Subsequently, a mask material such as a resist film is formed on the surface of the substrate, and ions are implanted into the substrate to form the N+ diffusion layers 7 and 8 on the N-wells 2 and 3. Thereafter, the mask material is removed. Thus, a semiconductor device as shown in FIG. 1 can be made.

According to example 1, even in a miniaturized semiconductor device, a separation breakdown voltage between the N-wells 2 and 3 as well as between the deeply-implanted N-wells 9 and 10 is improved. Thus, the interval between the N-wells 2 and 3 can be shortened effectively. In addition, it is possible to maintain the separation breakdown voltage and interval between the N-wells 2 and 3 in a circuit supplied with a higher voltage. Further, since it is only necessary to implant additional ions into a deep area of the substrate, adverse effects (change in well resistance, junction capacitance, or the like) which may be caused before or after the additional ion implantation can be minimized. A separation breakdown voltage between the N-wells 102 and 103 of the conventional example 3 (see FIG. 8) can be improved to some extent by increasing an impurity implantation amount (increasing the ion implantation energy and the dose amount) in the P-wells 104 and 105. However, the improvement is not as great as that provided by the present invention, and the above method produces adverse effects such as an increase of well resistance value, junction capacitance value, or the like.

Example 2

Figure 6:
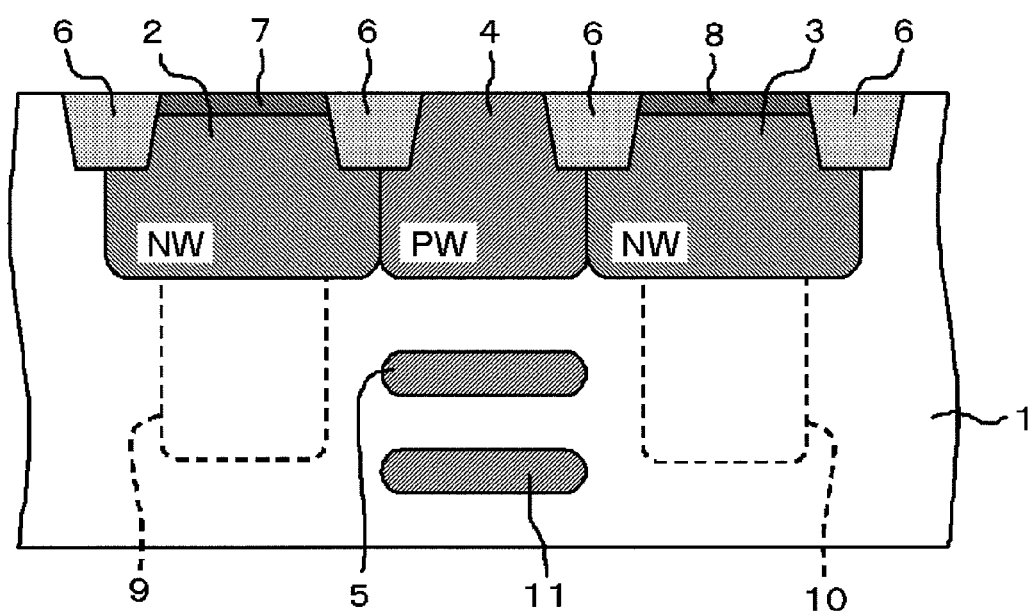
FIG. 6 schematically shows a partial cross section of a structure of a semiconductor device according to example 2 of the present invention.
Figure 7:
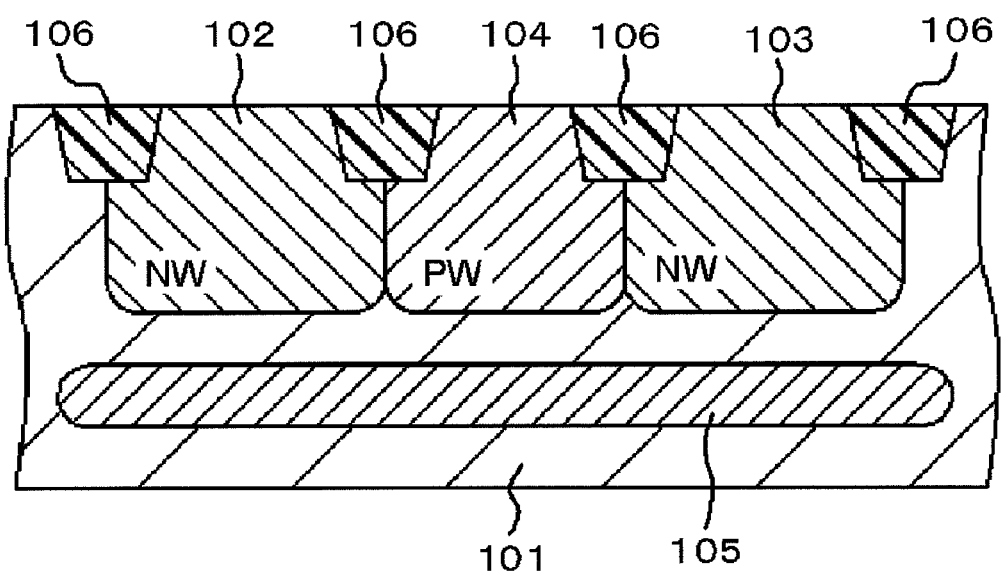
FIG. 7 schematically shows a partial cross section of a structure of a semiconductor device according to conventional example 2.

A semiconductor device according to example 2 of the present invention will be described with reference to drawings. FIG. 6 schematically shows a partial cross section of a structure of the semiconductor device according to example 2 of the present invention.

The semiconductor device according to example 2 differs from the semiconductor device according to example 1 (see FIG. 1) in that the P-wells 5 and 11 are formed only below the P-well 4. Namely, the P-wells 5 and 11 are not formed below the N-wells 2 and 3 or the neighboring elements thereof. Other features of example 2 are similar to those of example 1.

Referring to FIG. 6, based on the semiconductor device according to example 2, two N-wells 2 and 3 are formed on a P-type semiconductor substrate 1, and a P-well 4 is formed between the N-wells 2 and 3. A P-well 5 is formed below the P-well 4, and a P-well 11 is formed below the P-well 5 with a peak position at a given depth (or distance) with a peak position at a predetermined depth (or distance). A trench isolation insulating film 6 is formed between the N-well 2 and the P-well 4, and another trench isolation insulating film 6 is formed between the N-well 3 and the P-well 4. In addition, the N-wells 2 and 3 are each provided with another trench isolation insulating film 6, on the opposite side of the P-well 4, between the respective N-well and a neighboring element thereof (not shown). N+ diffusion layers 7 and 8 are formed on the N-wells 2 and 3 for connection to a contact plug (not shown). Below the N-wells 2 and 3, there are formed deeply-implanted N-wells 9 and 10 which are implanted deeply into the substrate through channeling that occurs when the N+ diffusion layers 7 and 8 are formed.

Next, a method for manufacturing the semiconductor device according to example 2 of the present invention will be described.

First, a silicon dioxide film is formed on the P-type semiconductor substrate 1, and a silicon nitride film is formed on the silicon dioxide film. Openings for the trench isolation insulating films 6 are formed in the silicon dioxide film and the silicon nitride film.

Next, by using the silicon dioxide film and the silicon nitride film having the openings as masks, portions of the P-type semiconductor substrate 1 exposed in the openings are removed by etching, so as to form trenches each having a predetermined depth.

Next, a silicon dioxide film (which will be used as the trench isolation insulating films 6) is deposited by chemical vapor deposition (CVD) on the entire surface of the substrate. Subsequently, by using the silicon nitride film as a stopper film, the silicon dioxide film formed by CVD is planarized by chemical mechanical polishing (CMP).

Next, the silicon dioxide film and the silicon nitride film used as masks are removed.

Next, a mask material such as a resist film is formed on the surface of the substrate, and ions are implanted into the substrate to form the P-well 11.

Next, the P-well 5 is formed by implanting ions into the substrate without removing the mask material formed in the previous process. The ion implantation energy for the formation of the P-well 5 is smaller than that for the formation of the P-well 11.

Next, the P-well 4 is formed by implanting ions into the substrate without removing the mask material used in the previous process. Thereafter, the mask material is removed.

Next, a mask material such as a resist film is formed on the surface of the substrate, and ions are implanted into the substrate to form the N-wells 2 and 3. Thereafter, the mask material is removed.

Subsequently, a mask material such as a resist film is formed on the surface of the substrate, and ions are implanted into the substrate to form the N+ diffusion layers 7 and 8 on the N-wells 2 and 3. Thereafter, the mask material is removed. Thus, a semiconductor device as shown in FIG. 6 can be made.

According to example 2, as in example 1, a separation breakdown voltage between the N-wells 2 and 3 and the deeply-implanted N-wells 9 and 10 is improved, and an interval between the N-wells 2 and 3 can be shortened. The separation breakdown voltage and the interval can be also maintained in a circuit supplied with a higher voltage. Further, there are no adverse effects such as changes in the value of N-well resistance, junction capacitance, or the like.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
   a first conductivity type semiconductor substrate;
   two first wells of a second conductivity type, which is opposite to the first conductivity type, arranged on a surface layer of the semiconductor substrate with a predetermined interval therebetween;
   a first conductivity type second well arranged between the two first wells on the surface layer of the semiconductor substrate and having an impurity concentration higher than that of the semiconductor substrate;
   a first conductivity type third well arranged in the semiconductor substrate, at least having an impurity concentration peak position below that of the second well and having an impurity concentration higher than that of the semiconductor substrate and lower than that of the second well; and
   a first conductivity type fourth well arranged in the semiconductor substrate, at least having an impurity concentration peak position below that of the third well and having an impurity concentration higher than that of the semiconductor substrate and lower than that of the second well.

2. The semiconductor device according to claim 1, further comprising a first conductivity type diffusion layer arranged on the first wells, respectively, and having an impurity concentration higher than that of the first wells.

3. The semiconductor device according to claim 2, wherein the third well has an impurity concentration peak position disposed at least below that of the second well and the first wells in the semiconductor substrate.

4. The semiconductor device according to claim 1, wherein the third well has an impurity concentration peak position disposed at least below that of the second well and the first wells in the semiconductor substrate.

5. The semiconductor device according to claim 1, wherein the impurity concentration peak position of the third well is deeper than that of the second well by 0.3 μm or more but not more than 0.8 μm, and the impurity concentration peak position of the fourth well is deeper than that of the third well by 0.3 μm or more but not more than 0.9 μm.

6. The semiconductor device according to claim 1, wherein the impurity concentration of the third well and that of the fourth well are set to be increased as the interval between the two first wells decreases.

7. The semiconductor device according to claim 1, wherein each of the third and fourth wells is an area formed by ion implantation.

8. The semiconductor device according to claim 1, wherein said third well and the fourth well extend throughout the entire area of the substrate.

9. The semiconductor device according to claim 1, wherein said third well and the fourth well are disposed in an area lying below the second well.

10. A semiconductor device manufacturing method comprising:
    implanting ions into the entire surface of a first conductivity type semiconductor substrate to form a first conductivity type fourth well;
    implanting ions into the entire surface of the semiconductor substrate to form a first conductivity type third well having an impurity concentration peak position higher than that of the fourth well;
    forming a first conductivity type second well having an impurity concentration peak position higher than that of the third well at a predetermined area on a surface layer of the semiconductor substrate; and
    forming first wells of a second conductivity type, which is opposite to the first conductivity type, having an impurity concentration peak position higher than that of the third well at areas on both sides of the second well on the surface layer of the semiconductor substrate, respectively.

11. A semiconductor device manufacturing method comprising:
    forming a mask material having an opening in a predetermined area on a surface of a first conductivity type semiconductor substrate;
    implanting ions into the semiconductor substrate by using the mask material as a mask to form a first conductivity type fourth well;
    implanting ions into the semiconductor substrate by using the mask material as a mask to form a first conductivity type third well having an impurity concentration peak position higher than that of the fourth well;
    forming a first conductivity type second well having an impurity concentration peak position higher than that of the third well on a surface layer of the semiconductor substrate by using the mask material as a mask; and
    removing the mask material and forming first wells of a second conductivity type, which is opposite to the first conductivity type, having an impurity concentration peak position higher than that of the third well on both sides of the second well, respectively.

* * * * *